United States Patent
Becker

(10) Patent No.: US 6,865,119 B2
(45) Date of Patent: Mar. 8, 2005

(54) NEGATIVELY CHARGED WORDLINE FOR REDUCED SUBTHRESHOLD CURRENT

(75) Inventor: Scott T. Becker, Darien, IL (US)

(73) Assignee: Artisan Components, Inc., Sunnyvale, CA (US)

(*) Notice: Subject to any disclaimer, the term of this patent is extended or adjusted under 35 U.S.C. 154(b) by 20 days.

(21) Appl. No.: 10/364,719

(22) Filed: Feb. 10, 2003

(65) Prior Publication Data
US 2004/0156244 A1 Aug. 12, 2004

(51) Int. Cl.[7] .................................................. G11C 7/00
(52) U.S. Cl. ............. 365/189.11; 365/154; 365/189.09; 365/230.05
(58) Field of Search ............................ 365/189.11, 154, 365/189.09, 230.05

(56) References Cited

U.S. PATENT DOCUMENTS

| | | | | | |
|---|---|---|---|---|---|
| 6,046,956 | A | * | 4/2000 | Yabe | 365/230.06 |
| 6,049,495 | A | * | 4/2000 | Hsu et al. | 365/203 |
| 6,097,665 | A | * | 8/2000 | Tomishima et al. | 365/230.06 |
| 6,611,451 | B1 | * | 8/2003 | Houston | 365/154 |
| 2001/0053093 | A1 | * | 12/2001 | Ogura et al. | 365/185.23 |

* cited by examiner

Primary Examiner—Hoai Ho
(74) Attorney, Agent, or Firm—Martine & Penilla, LLP

(57) ABSTRACT

An invention is provided for reducing subthreshold current in memory core cells. A memory array having a plurality of memory core cells is provided. Each memory core cell in the memory array is selectable using a word line. A selected word line addressing a particular memory core cell is charged to a positive voltage. In addition, unselected wordlines of the memory array are charged to a negative voltage. In this manner, subthreshold current associated with unselected memory core cells is reduced.

16 Claims, 7 Drawing Sheets

NEGATIVELY CHARGED WORDLINE FOR REDUCED SUBTHRESHOLD CURRENT

BACKGROUND OF THE INVENTION

1. Field of the Invention

This invention relates generally to computer memories, and more particularly to negatively charged unselected word lines for reducing subthreshold current in computer memories.

2. Description of the Related Art

Most integrated circuit devices are required to have some type of memory device for storing information. As a result, there is a growing trend to integrate embedded memory arrays directly onto the chip, such as an application specific integrated circuit (BASIC). Typically, when a memory device is embedded into a chip, the memory device (e.g., an SCRAM) is provided with data reading and writing circuitry defined by a plurality of transistors. However, transistor geometries currently are becoming smaller. That is, the transistor gate lengths are becoming thinner, hence the distance between a transistor's source and drain is shrinking. As a result, transistors are leaking current between the source and drain terminals when the transistors are OFF, that is, when $V_{GS}=0$. Unfortunately, when transistors conduct current in this manner, memory devices experience degraded performance and can become non-functional.

FIG. 1 is a schematic diagram showing a section of a conventional memory array column 100. The conventional memory array column 100 includes a pair of bit lines 102a and 102b coupled to a plurality of wordlines 104a–104n. Each wordline 104a–104n addresses a core cell 101a–101n in the memory array column 100 defined by a first pass gate transistor 106, a second pass gate transistor 108, a first inverter 110, and a second inverter 112. In each core cell 101a–101n, the first pass gate transistor 106 includes a first terminal coupled to the bitline 102a and a second terminal coupled to both the input of the first inverter 110 and the output of the second inverter 112. In addition, the gate of the first pass gate transistor 106 is coupled to the wordline 104a–104n. The second pass gate transistor 108 includes a first terminal coupled to the complimentary bitline 102b and a second terminal coupled to both the input of the second inverter 112 and the output of the first inverter 110. As above, the gate of the second pass gate transistor 108 is coupled to the wordline 104a–104n.

The value stored in each core cell 101a–101n depends on the voltage values stored on nodes 114 and 116, which are always the inverse of each other. Hence, when node 116 is high, node 114 is low, and vice versa. Generally, these node values are isolated from the bitlines 102a and 102b until the core cell 101a–101n is selected by driving the wordline 104a–104n to the core cell high. For example, during a read operation, the pass gate transistors 106 and 108 turn ON when the wordline 104a–104n is high, and allow the core cell to set the values of the bitlines.

Ideally, when reading core cell 101a, the bitlines 102a and 102b are first precharged to $V_{DD}$. The wordline 104a is then asserted high to address the core cell 101a, turning ON pass gate transistors 106 and 108. If the core cell 101a stores a low at node 114 and a high at node 116, the voltage on bitline 102a is lowered via pass gate transistor 106, while the voltage on bitline 102b remains unchanged because the voltage on both terminals of pass gate transistor 108 is $V_{DD}$. Hence, a voltage differential develops between the bitlines 102a and 102b, which can be sensed via a sense amp during the read operation.

Unfortunately, the small geometries of the pass gate transistors 106 and 108 result in a subthreshold leakage current flowing across the source and drain of the pass gate transistors 106 and 108. As a result, when a majority of core cells in a column store values different from the selected core cell, read problems can occur. For example, if core cell 101a stores a low on node 114 and a high on node 116, and the remaining core cells of the column store a high on node 114 and low on node 116, problems can occur when a read operation is performed on core cell 101a.

In particular, during the read operation, wordline 104a is asserted high, turning on the pass gate transistors 106 and 108 of core cell 101a. Since node 114 of core cell 101a is low, a read current $I_R$ 120 flows from the bitline 102a across pass gate transistor 106, thus lowering the voltage on bitline 102a. However, as mentioned above, the small geometries of the pass gate transistors 106 and 108 result in a subthreshold leakage current. Hence, the pass gate transistor 108, which is coupled to the complementary bitline 102b, of each of the unselected core cells 101b–101n allows a subthreshold current $I_{Leak}$ 122 to flow from bitline 102b, thus slightly lowering the voltage on bitline 102b.

On an individual core cell basis, this leakage current through the unslected pass transistors 108 in core cells 101b through 101n on the complementary bitline 102b is small, about 10 nA. However, generally a memory array includes in excess of one thousand core cells per column. As a result, the small subthreshold current is multiplied by one thousand, which results in a bitline current of several micro amps. Since both the read current $I_R$ 120 and the combined subthreshold leakage current $I_{Leak}$ 122 are several micro amps, the voltage on both the bitlines 102a and 102b drops at the same or approximately the same rate. Consequently, read performance and read errors occur.

FIG. 2A is a graph 200 showing conventional bitline voltages during a read operation wherein subthreshold read errors occur. As shown in graph 200, when the voltage on the wordline 104a rises, the voltage on both bitlines 102a and 102b falls at approximately the same rate. Hence, the voltage differential between the bitlines 102a and 102b is very small or zero. Consequently, the sense amp cannot sense the voltage differential between the bitlines 102a and 102b and as a result a read error occurs. The voltage levels of graph 200 generally result when the combined subthreshold leakage current of the unselected core cells approximates the read current of the selected core cell. However, read performance can also be affected when the combined subthreshold leakage current of the unselected core cells is less than the read current of the selected core cell, as described next with reference to FIG. 2B.

FIG. 2B is a graph 250 showing conventional bitline voltages during a read operation wherein subthreshold current degrades read performance. As shown in graph 250, when the voltage on the wordline 104a rises, the voltage on bitline 102a falls at a faster rate than the voltage on bitline 102b. Hence, the voltage differential 252 between the bitlines 102a and 102b eventually reaches a readable level. However, unlike an ideal read operation, wherein the voltage differential reaches a readable level at time t, the voltage differential 252 of FIG. 2B reaches a readable level at a later time t+Δt. Consequently, the time period required to sense the voltage differential between the bitlines 102a and 102b is increased and as a result performance is degraded.

To address this issue in DRAMs, charge pumps have conventionally been used to negatively charge the substrate, which increases the threshold voltage of transistors and reduces leakage. This is performed using triple well technology. Hence, the well of a core cell can be isolated and used to negatively charge the substrate, which effectively raises the threshold voltage of the transistors. Unfortunately, this slows the performance of the transistors in the DRAM. Moreover, SRAMs generally use CMOS technology, which does not include triple wells. Consequently, the substrate cannot be negatively charged in an SRAM without biasing all the transistors of the SRAM, which slows down all the logic of the SRAM.

In view of the foregoing, there is a need for a method that reduces subthreshold current in core cells. The method should reduce subthreshold current without reducing the performance of all the logic of the memory device, or the core cell. Moreover, the method should not require large area increases in the memory device.

SUMMARY OF THE INVENTION

Broadly speaking, the present invention fills these needs by negatively biasing the wordlines of a memory array. As a result, subthreshold current is reduced without degrading transistor performance in the entire memory device. In one embodiment, a method for reducing subthreshold current in memory core cells is disclosed. A memory array having a plurality of memory core cells is provided. Each memory core cell in the memory array is selectable using a wordline. Then, a selected wordline addressing a particular memory core cell is charged to a positive voltage. Further, unselected wordlines of the memory array are charged to a negative voltage. In this manner, subthreshold current associated with unselected memory core cells is reduced. In one aspect, the negative voltage source can be a charge pump. In addition, a negative voltage for the charge pump can be stored using the capacitance of the core cells that comprise the memory array. Generally, the unselected wordlines can be negatively charged using a wordline deselect signal that is in communication with a negative voltage source, such as the charge pump.

In a further embodiment, a memory device is disclosed. The memory device includes a plurality of memory core cells, and a plurality of wordlines, each in communication with at least one memory core cell. As above, each wordline is capable of addressing a memory core cell when the wordline is selected. The memory device also includes a plurality of wordline drivers. Each wordline driver is associated with a particular wordline. In addition, each wordline driver negatively charges the associated wordline when the associated wordline is unselected. In one aspect, the memory device can include a wordline deselect signal that is in communication with a negative voltage source. In this manner, the deselect signal can provide negative voltage for unselected wordlines. As mentioned above, the negative voltage source can be a charge pump wherein the negative voltage for the charge pump is stored using the capacitances of the core cells that comprise the memory array. In addition, the charge pump can further store negative voltage using the capacitances of memory core cells that comprise the core array of a second memory device.

A wordline driver system is disclosed in yet a further embodiment of the present invention. The wordline driver system includes a wordline, and a wordline charging element that has a first transistor coupled to a positive voltage supply and a second transistor coupled to a negative voltage supply. In operation, the wordline charging element charges the wordline to a positive voltage when the wordline is selected, and to a negative voltage when the wordline is unselected. In one aspect, the first transistor can be a p-channel transistor that has a first terminal in communication with the positive voltage supply and a second terminal in communication with the wordline. In addition, the second transistor can be an n-channel transistor that has a first terminal in communication with the wordline and a second terminal in communication with a wordline deselect signal. As above, the wordline deselect signal can be in communication with the negative voltage supply. Further, the gate of the first transistor can be coupled to the gate of the second transistor. In such a configuration, the gates of the first transistor and second transistor can be in communication with an address signal that selects the wordline. Also as mentioned above, the negative voltage source can be a charge pump that stores the negative voltage for the charge pump using the capacitances of core cells that comprise an associated memory array.

By reducing the subthreshold leakage current in the pass gate transistors, embodiments of the present invention advantageously prevent performance degradation and failures during read operations. Moreover, when a charge pump is used to provide a negative voltage to the wordline deselect signal, embodiments of the present invention advantageously utilize the memory array as a charge pump capacitor. In this manner, embodiments of the present invention eliminate the need for a separate charge pump capacitor to store the negative pump voltage. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for reducing subthreshold current in memory core cells using negatively charged wordlines. By negatively biasing the wordlines, subthreshold current is reduced without degrading transistor performance in the entire memory device. In this manner, embodiments of the present invention can be utilized with any memory having a wordline. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
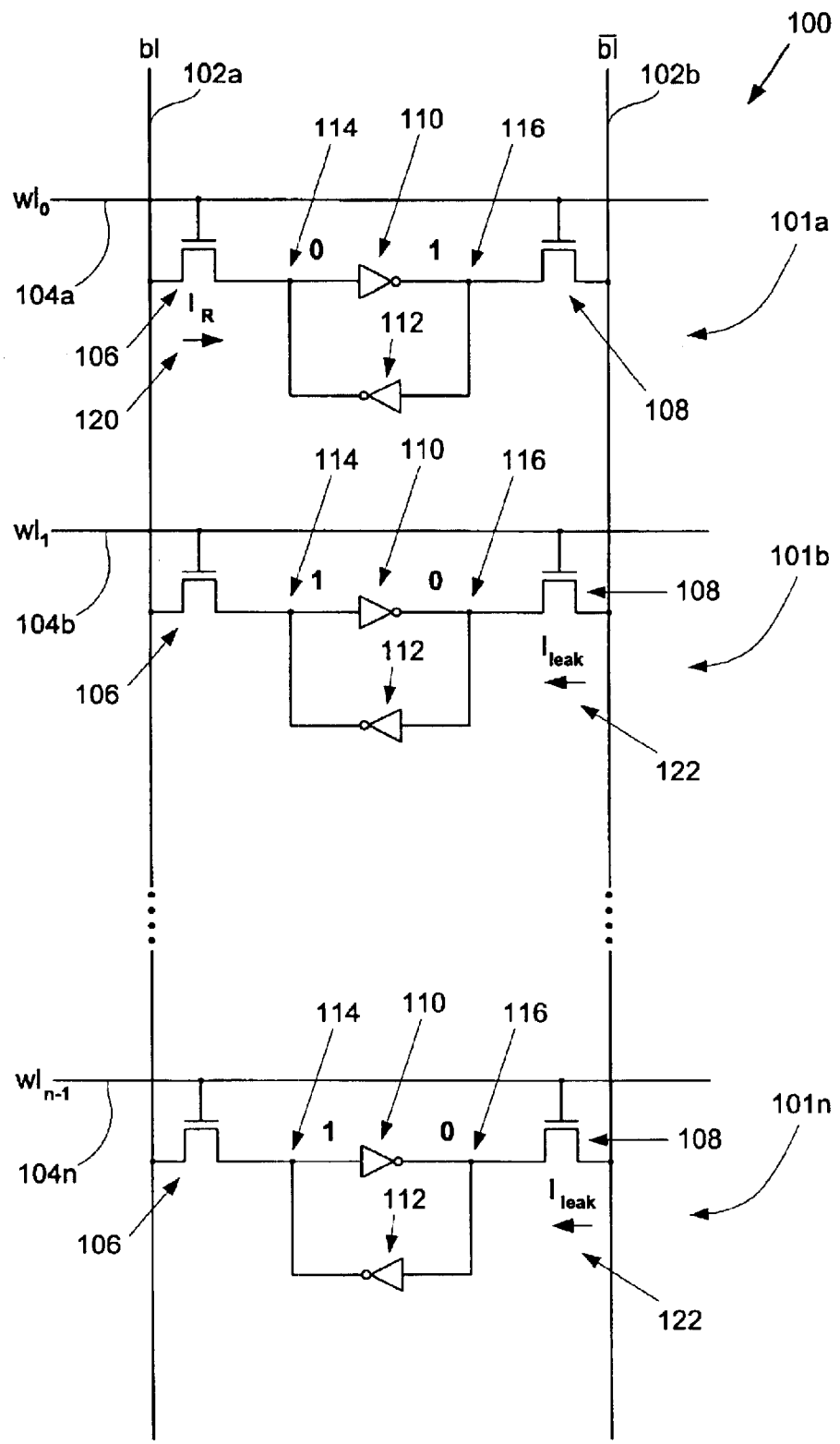
FIG. 1 is a schematic diagram showing a section of a conventional memory array column.
Figure 2A:
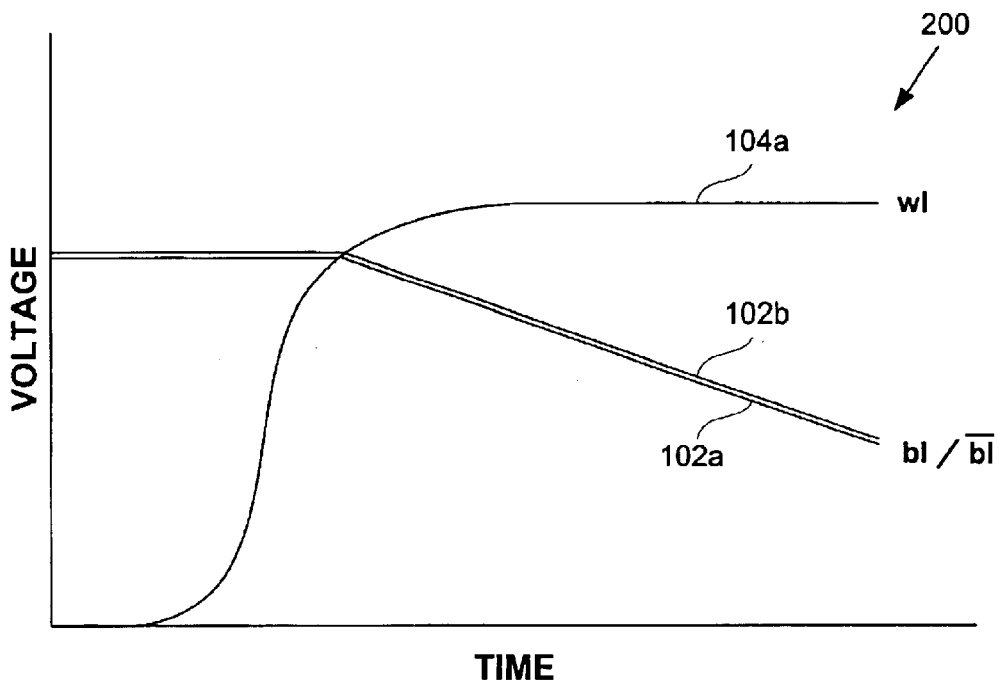
FIG. 2A is a graph showing conventional bitline voltages during a read operation wherein subthreshold read errors occur.
Figure 2B:
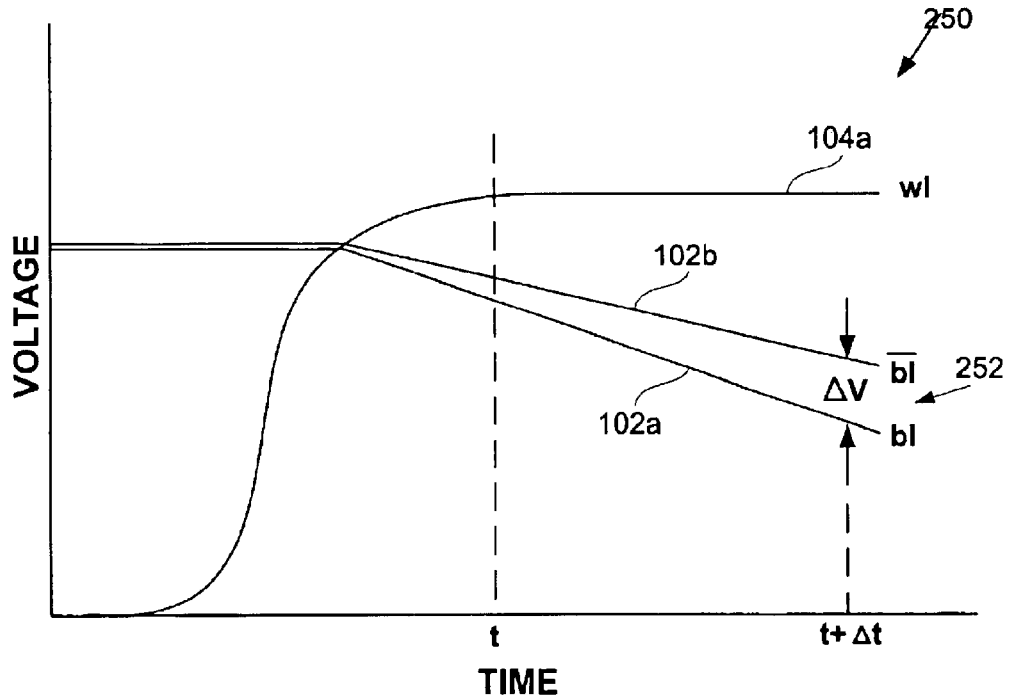
FIG. 2B is a graph showing conventional bitline voltages during a read operation wherein subthreshold read performance is degraded.
Figure 3A:
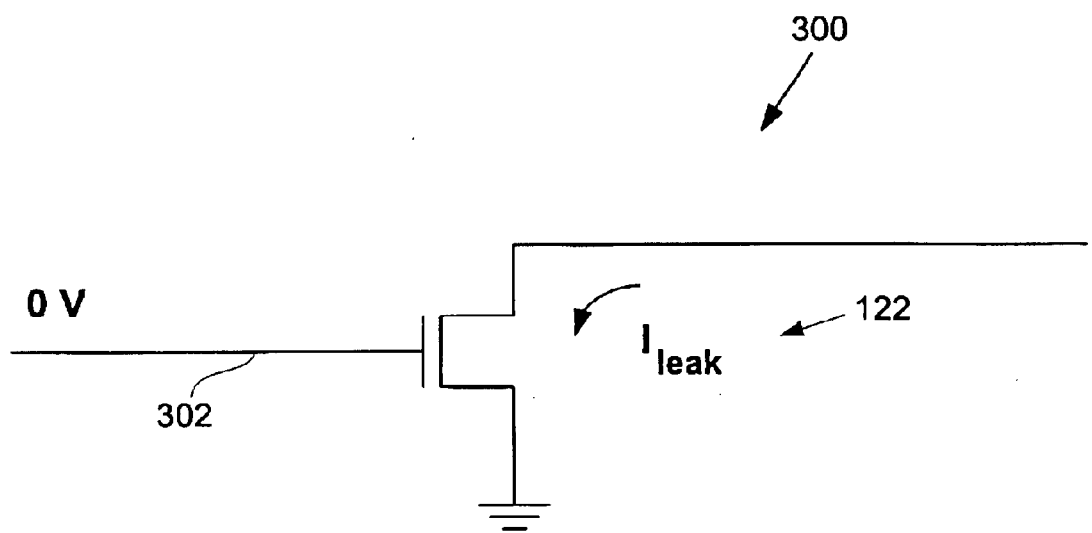
FIG. 3A shows an n-channel transistor having zero voltage applied to the gate.
Figure 3B:
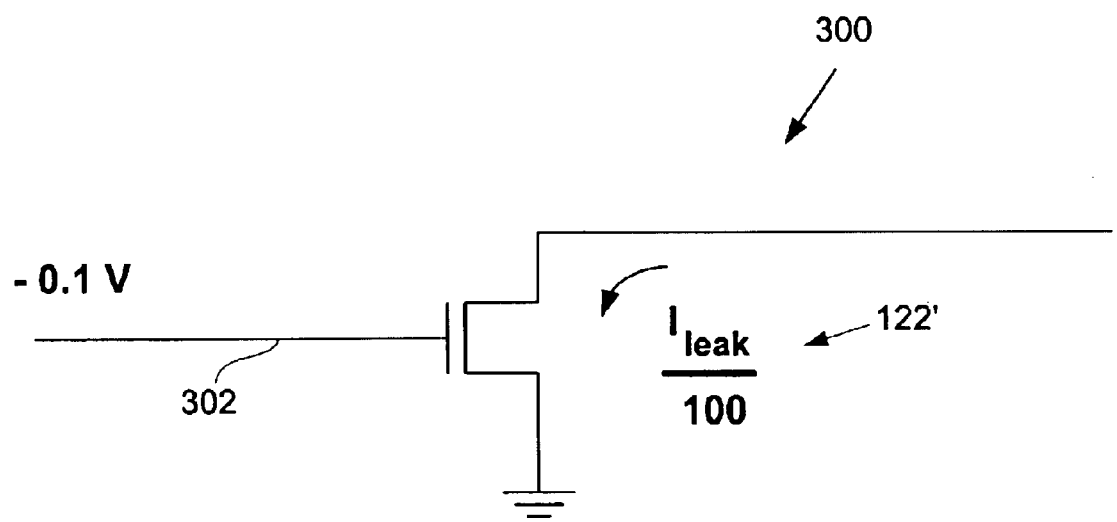
FIG. 3B shows the n-channel transistor having a negative voltage applied to the gate, in accordance with an embodiment of the present invention.

FIGS. 1, 2A, and 2B were described in terms of the prior art. FIGS. 3A and 3B illustrate subthreshold current resulting from various gate voltages. In particular, FIG. 3A shows an n-channel transistor 300 having zero voltage applied to the gate. As mentioned previously, the small geometries of today's transistor technologies result in current leakage when $V_{GS}-V_{Tn}=0$ or when $V_{GS}=0$. For example, when zero voltage is applied to the gate 302 of n-channel transistor 300, which turns the transistor 300 OFF, a subthreshold leakage current 122 continues to flow across the source and drain. However, when the gate of transistor 300 is negatively charged, the subthreshold current is reduced.

FIG. 3B shows the n-channel transistor 300 having a negative voltage applied to the gate, in accordance with an embodiment of the present invention. As shown in FIG. 3B, a –0.1 volt negative charge has been applied to the gate 302 of the n-channel transistor 300, effectively creating an absence of electrons beneath the gate 302 of transistor 300. As a result, the subthreshold leakage current 122' is greatly reduced to about $I_{Leak}/100$. By reducing the subthreshold leakage current 122' in pass gate transistors, embodiments of the present invention advantageously prevent performance degradation and failures during read operations. To achieve this, embodiments of the present invention negatively charge unselected wordlines during read operations, as described in greater detail next with reference to FIG. 4.

Figure 4:
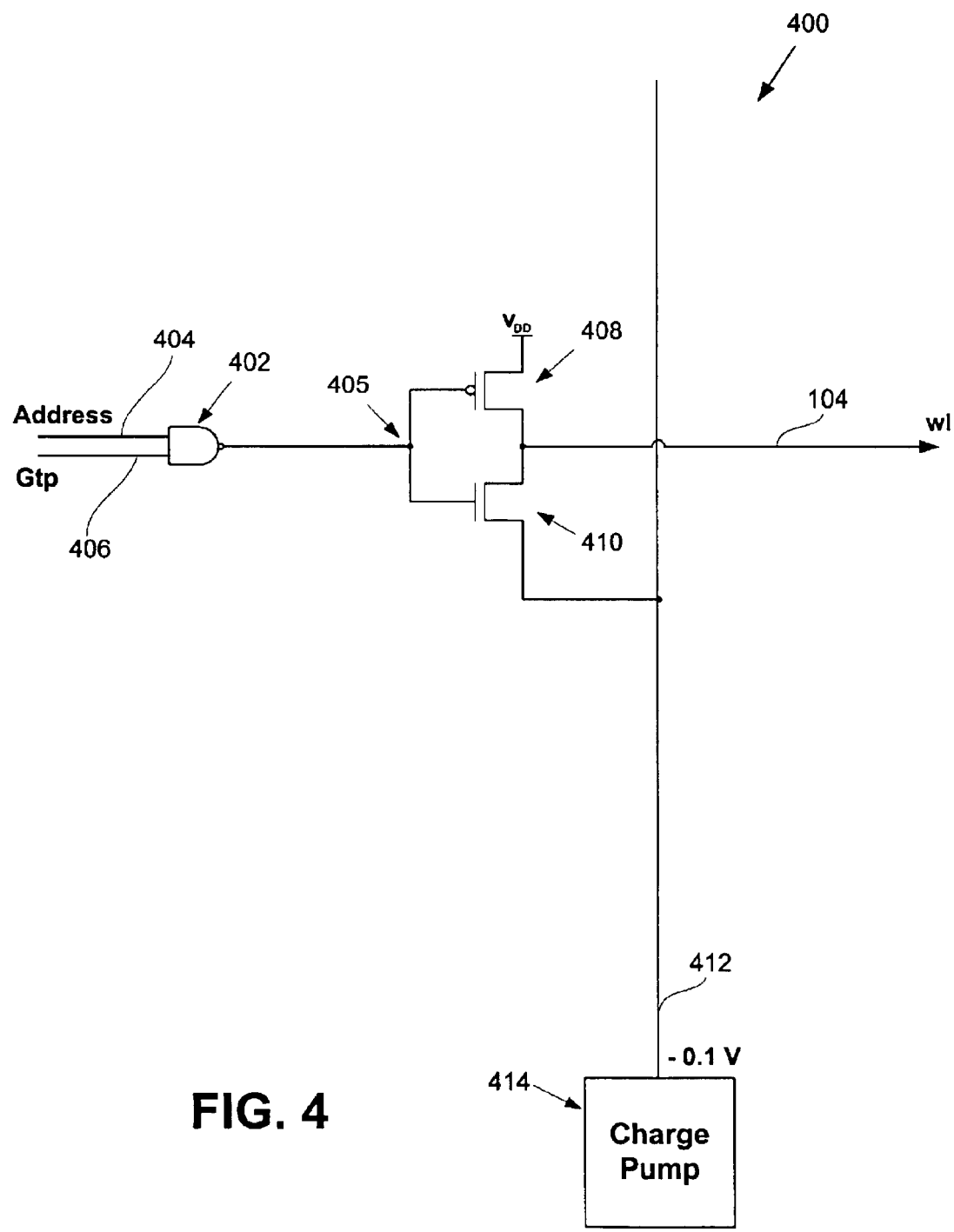
FIG. 4 is a schematic diagram showing an exemplary wordline driver circuit, in accordance with an embodiment of the present invention.

FIG. 4 is a schematic diagram showing an exemplary wordline driver circuit 400, in accordance with an embodiment of the present invention. Included in the wordline driver circuit 400 is a two input NAND gate 402, which receives an address signal 404 and a global timing pulse (GTP) signal 406. The address signal 404 is asserted high when a memory core cell coupled to the wordline 104 is selected. The GTP signal 406 is used to synchronize the read operation, and is asserted high when a read operation is to occur. Hence, the output of the NAND gate 402 is only low when both the wordline 104 is selected, indicated by the address signal 404 being high, and when the proper read cycle occurs, indicated by the GTP signal 406 being high. Otherwise, the output of the NAND gate 402 is high.

Coupled to the output of the NAND gate 402 are the gate of p-channel transistor 408 and the gate of n-channel transistor 410. The p-channel transistor 408 includes a first terminal coupled to $V_{DD}$ and a second terminal coupled to the wordline 104. Also coupled to the wordline 104 is a first terminal of the n-channel transistor 410, which also includes a second terminal coupled to a wordline deselect signal 412. A charge pump 414 charges the wordline deselect signal to a negative voltage, for example, –0.1 V.

During a read operation in which the wordline 104 is selected, the address signal 404 and the GTP signal 406 are asserted high. As a result, the NAND gate 402 transfers a low to node 405, which makes the gates of transistors 408 and 410 low. The low at the gate of n-channel transistor 410 turns OFF current flow between the terminals of n-channel transistor 410. Hence, the wordline 104 is isolated from the wordline deselect signal 412. In addition, the low at the gate of the p-channel transistor 408 turns ON the transistor 408, allowing $V_{DD}$ to transfer to the wordline 104. As a result, when the wordline 104 is selected, the wordline 104 is charged to $V_{DD}$ and the appropriate memory core cell can be read.

During a read operation in which the wordline 104 is not selected, the address signal 404 is low. As a result, the NAND gate 402 transfers a high to node 405 regardless of voltage on the GTP signal 406. The high at the gate of the p-channel transistor 408 turns OFF current flow between the terminals of transistor 408. Hence, the wordline 104 is isolated from $V_{DD}$. Further, the high at the gate of the n-channel transistor 410 turns ON the transistor 410, allowing the negative voltage on the wordline deselect signal 412 to transfer to the wordline 104. As a result, when the wordline 104 is not selected, the wordline 104 is charged to the negative voltage on the wordline deselect signal 412, which in the example of FIG. 4 is –0.1 V. The negative voltage on the wordline 104 negatively biases the gates of the core cell pass gate transistors coupled to the wordline 104. As a result, the subthreshold leakage current is greatly reduced on the non-selected pass gate transistors coupled to the wordline 104. Moreover, the combined leakage current occurring in the non-selected core cells is reduced by a factor of about one hundred. Consequently, the parallel combination of large leakage currents is prevented during read operations, such as those discussed previously with reference to FIGS. 1, 2A, and 2B.

Figure 5:
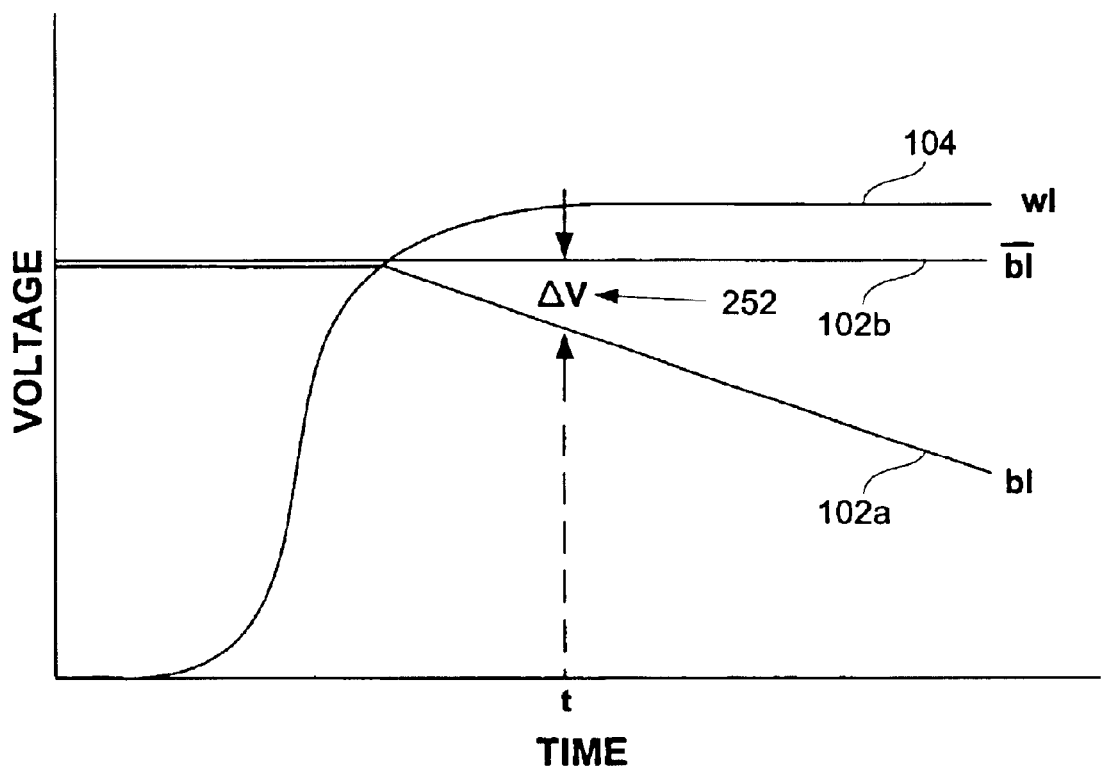
FIG. 5 is a graph showing bitline voltages during a read operation using negatively charged non-selected wordlines, in accordance with an embodiment of the present invention.

FIG. 5 is a graph 500 showing bitline voltages during a read operation using negatively charged non-selected wordlines, in accordance with an embodiment of the present invention. In particular, graph 500 illustrates bitline voltages during read operations in which the selected core cell stores a value opposite of that stored in the majority, or all, the remaining core cells in the memory array column. As shown in graph 500, when the voltage on the wordline 104 rises, the voltage on bitline 102a falls, while the voltage on bitline 102b remains relatively unchanged. Hence, the voltage differential 252 between the bitlines 102a and 102b reaches a readable level at time t. Unlike conventional memory arrays, wherein the voltage differential occurs at time t+Δt, or not at all, in such a situation, the voltage differential 252 occurs at time t using the embodiments of the present invention. Consequently, the time period required to sense the voltage differential between the bitlines 102a and 102b is decreased and as a result performance is greatly improved.

Referring back to FIG. 4, the charge pump 414, as mentioned above, charges the wordline deselect signal 412 to a negative voltage, such as –0.1 V. However, it should be noted that other mechanisms can be utilized to provide a negative voltage to the wordline deselect signal 412, such as an externally applied voltage. When a charge pump 414 is used to provide a negative voltage to the wordline deselect signal 412, embodiments of the present invention advantageously utilize the memory array as a charge pump capacitor. In this manner, embodiments of the present invention eliminate the need for a separate charge pump capacitor to store the negative pump voltage.

Figure 6:
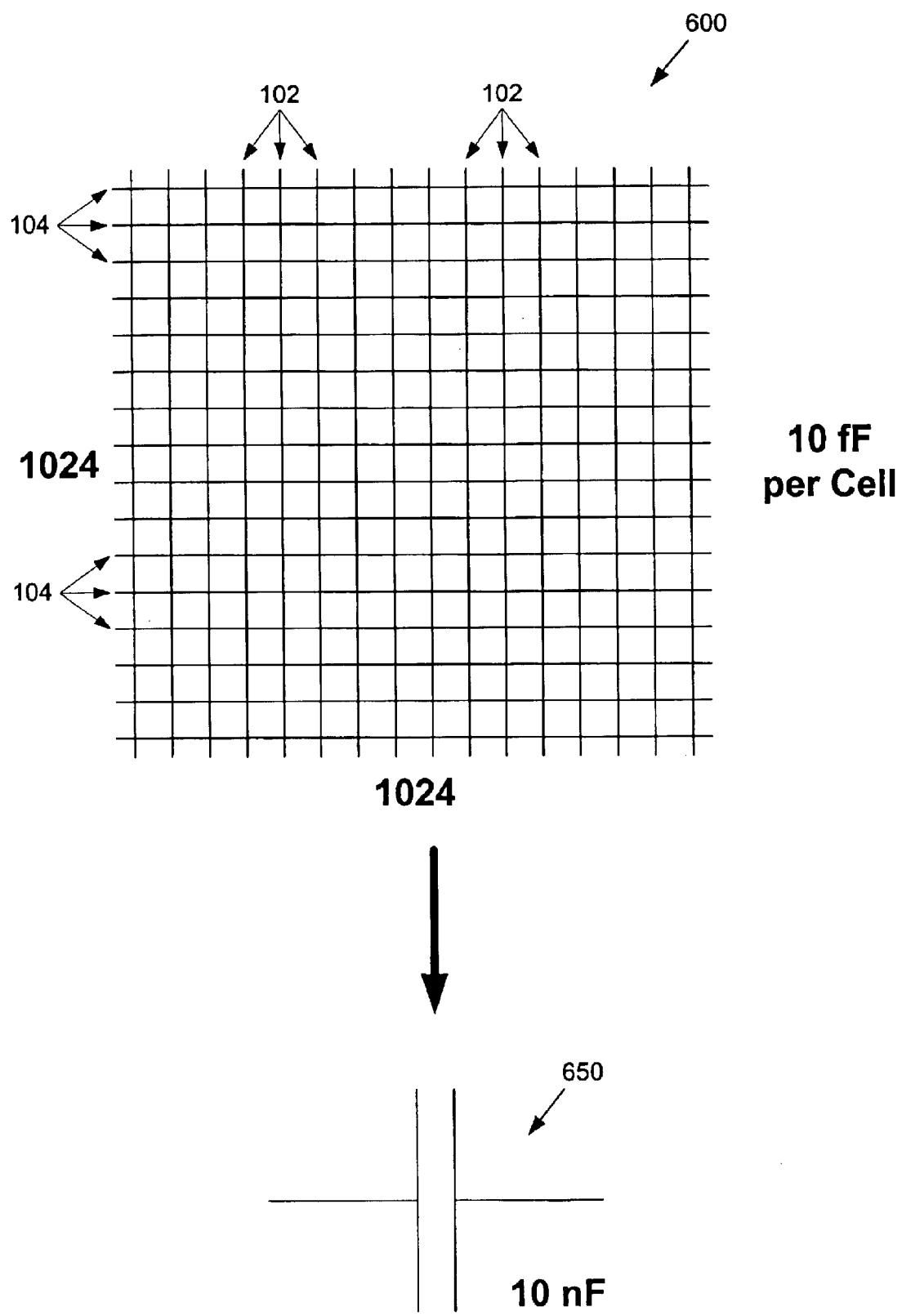
FIG. 6 is a diagram showing an exemplary memory array, in accordance with an embodiment of then present invention.

FIG. 6 is a diagram showing an exemplary memory array 600, in accordance with an embodiment of then present invention. The memory array 600 includes a plurality of bitline pairs 102 coupled to a plurality of wordlines 104 to form the memory core cells of the array 600. Typically, the memory array 600 includes at least 1024 rows and 1024 columns. Thus, a typical memory array 600 includes in excess of one million core cells.

During a read operation, only one wordline 104 in the memory array 600 is asserted high. Hence, all other wordlines 104 of the memory array 600 are negatively charged. As a result, at least one million core cells, each having a pair of pass gate transistors with a low, or negative, voltage at their gates, are available. The gate capacitance of these transistors can be used to form a capacitor. Thus, embodiments of the present invention utilize the memory array 600 as a capacitor 650 for the charge pump. For example, if the gate capacitance contributed by each core cell is about ten femto farads (fF), the combined capacitance of the exemplary memory array 600 is ten fF multiplied by at least one million core cells, which is about ten nano farads (nF). The ten nF capacitance of the memory array 600 can be utilized as the capacitor for the charge pump 414. Moreover, embodiments of the present invention can further connect the charge pump to additional memory arrays for additional charge pump capacitance. It should be noted that embodiments of the present invention can be utilized with any memory having a wordline, such as RAMs, ROMs, EPROMs, Flash EEPROMs, SRAMs, SDRAMs, CAMs, and any other memory that utilizes a wordline for memory addressing.

Figure 7A:
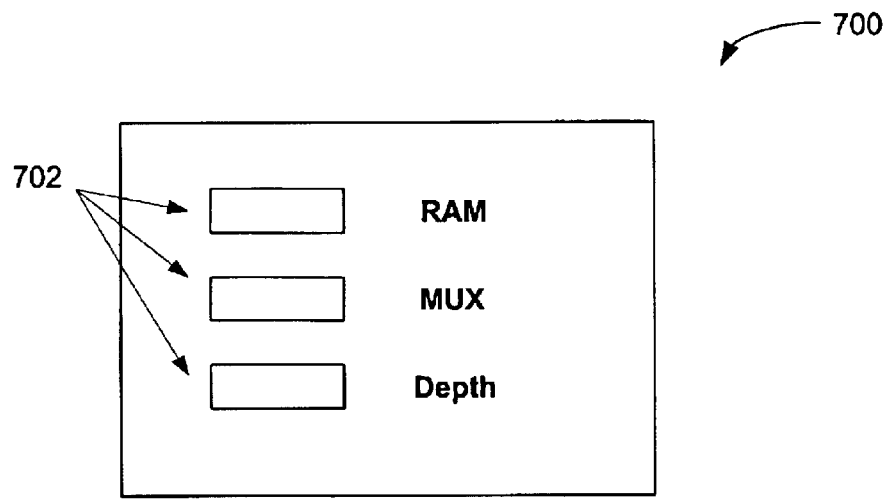
FIG. 7A is a block diagram showing an exemplary simplified memory generator graphical user interface (GUI) front end, in accordance with an embodiment of the present invention.

In one embodiment, optimum placement and utilization of the techniques of the present invention is implemented utilizing a memory generator. FIG. 7A is a block diagram showing an exemplary simplified memory generator graphical user interface (GUI) front end 700, in accordance with an embodiment of the present invention. The exemplary memory generator GUI 700 illustrates one view utilized for entering parameters into fields 702 to define a particular memory application. Broadly speaking, the memory generator checks the validity of the entered data and executes appropriate generators to define the memory application. After receiving data utilizing the GUI front end view 700, a memory generator of the embodiments of the present invention processes the data utilizing a memory generator backend, as described next with reference to FIG. 7B.

Figure 7B:
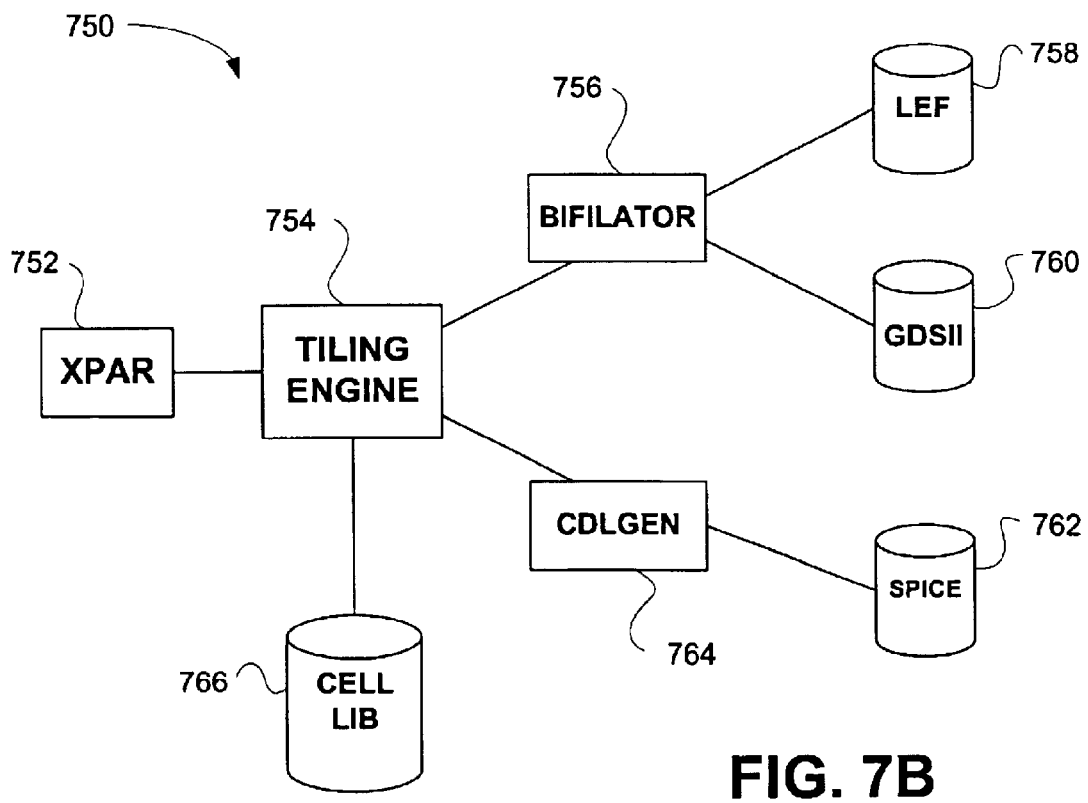
FIG. 7B is a block diagram showing an exemplary memory generator backend, in accordance with an embodiment of the present invention.

FIG. 7B is a block diagram showing an exemplary memory generator backend 750, in accordance with an embodiment of the present invention. The memory generator backend 750 comprises an XPAR process 752, a tiling engine 754, a Bifilator process 756, a CDLGEN process 764, and a cell library 766. Generally speaking, these processes function together to generate a LEF model 758, a GDSII model 760, and a SPICE model 762 for the particular memory application. The LEF model 758 comprises place and route information, which is utilized by routers to manufacture integrated circuits. The GDSII model 760 comprises mask layouts and is utilized by semiconductor foundries. The SPICE model 762 includes circuit interconnection definitions, operational properties, and schematic diagrams of the memory application. Thus, the designer can use the SPICE model of the application for cross verification.

As mentioned above, the exemplary memory generator backend 750 processes the data received via the GUI front end 700. More specifically, the XPAR process 752 encapsulates the rules needed to utilize particular cell layouts stored in the cell library. These rules, along with the parameter data for the memory application are then provided to the tiling engine 754 for optimization and cell placement. By separating the functions of the XPAR process 752 from those of the tiling engine 754, individual rules can be altered for specific applications without altering the functions and placement algorithms utilized in the timing engine 754.

The Bifilator process 756 generates an interface around a particular memory device or memory array. Generally, on a RAM there may exist over one thousand routing points for interfacing with the RAM. As a result, the entire routing configuration may change when a user changes the placement of the RAM, requiring intense reconfiguration. To address this issue, the Bifilator process 756 builds an interface around the RAM, which the user can use to interface with the RAM without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for reducing subthreshold current in memory core cells, comprising:

providing a memory array having a plurality of memory core cells, each memory core cell selectable using a wordline;

charging a selected wordline to a positive voltage, the selected wordline addressing a particular memory core cell;

charging unselected wordlines of the memory array to a negative voltage, whereby subthreshold current associated with unselected memory core cells is reduced, the charging of the unselected wordlines is accomplished through a charge pump; and storing the negative charge for the charge pump using capacitances of memory core cells that define the memory array.

2. A method as recited in claim 1, wherein the unselected wordlines are charged to a negative voltage using a wordline deselect signal that is in communication with a negative voltage source.

3. A method as recited in claim 2, further comprising the operation of negatively charging each unselected wordline using an associated n-channel transistor having a first terminal coupled to the wordline and a second terminal coupled to the wordline deselect signal.

4. A method as recited in claim 3, further comprising the operation of positively charging the selected wordline using a p-channel transistor having a first terminal coupled to $V_{DD}$ and a second terminal to the selected wordline.

5. A method as recited in claim 4, wherein a gate of the p-channel transistor is coupled to a gate of the n-channel transistor, and wherein the gate of the p-channel transistor and the gate of the n-channel transistor are in communication with an address signal that selects an associated wordline.

6. A memory device, comprising:

a plurality of memory core cells;

a plurality of wordlines, each wordline in communication with at least one memory core cell, each wordline capable of addressing a memory core cell when the wordline is selected; and a plurality of wordline drivers, each wordline driver associated with a particular wordline of the plurality of wordlines, wherein each wordline driver negatively charges an associated wordline when the associated wordline is unselected, wherein the negative charging is facilitated by a charge pump, and a negative voltage for the charge pump is obtained from capacitances of the core cells that comprise the memory array.

7. A memory device as recited in claim 6, further comprising a wordline deselect signal in communication with a negative voltage source, the deselect signal providing negative voltage for unselected wordlines.

8. A memory device as recited in claim 7, wherein each wordline driver includes a first transistor that couples the wordline deselect signal to the associated wordline when the wordline is unselected, and wherein each wordline driver further includes a second transistor that couples to the associated wordline to a positive voltage source when the associated wordline is selected.

9. A memory device as recited in claim 8, wherein the first transistor is an n-channel transistor having a first terminal in communication with the associated wordline and a second terminal in communication with the wordline deselect signal.

10. A memory device as recited in claim 9, wherein the second transistor is a p-channel transistor having a first terminal in communication with a positive voltage source and a second terminal in communication with the associated wordline.

11. A memory device as recited in claim 10, wherein a gate of the first transistor is coupled to a gate of the second transistor, and wherein the gate of the first transistor and the gate of second transistor are in communication with an address signal that selects the associated wordline.

12. A memory device as recited in claim 6, wherein the charge pump further stores negative voltage using capacitances of memory core cells that comprise a core array of a second memory device.

13. A wordline driver system, comprising:

a wordline; and a wordline charging element having a first transistor coupled to a positive voltage supply and a second transistor coupled to a negative voltage supply, wherein the wordline charging element charges the wordline to a positive voltage when the wordline is selected, and wherein the wordline charging element charges the wordline to a negative voltage when the wordline is unselected; and a charge pump for producing the negative voltage, a negative voltage for the charge pump being obtained from capacitances of core cells that comprise an associated memory array.

14. A wordline driver as recited in claim 13, wherein the first transistor is a p-channel transistor having a first terminal in communication with the positive voltage supply and a second terminal in communication with the wordline.

15. A wordline driver system as recited in claim 14, wherein the second transistor is an n-channel transistor having a first terminal in communication with the wordline and a second terminal in communication with a wordline deselect signal, the wordline deselect signal being in communication with the negative voltage supply.

16. A wordline driver system as recited in claim 15, wherein a gate of the first transistor is coupled to a gate of the second transistor, and wherein the gate of the first transistor and the gate of second transistor are in communication with an address signal that selects the wordline.

* * * * *